US012808942B2

(12) United States Patent
Kim

(10) Patent No.: US 12,808,942 B2
(45) Date of Patent: Nov. 24, 2026

(54) APPARATUS AND METHOD FOR PROACTIVE DETECTION OF THERMAL RUNAWAY USING BMS WITH EIS FUNCTION

(71) Applicant: HUNATE CO., LTD., Daegu (KR)

(72) Inventor: Jae-Goog Kim, Goyang-si (KR)

(73) Assignee: HUNATE CO., LTD., Daegu (KR)

( * ) Notice: Subject to any disclaimer, the term of this patent is extended or adjusted under 35 U.S.C. 154(b) by 285 days.

(21) Appl. No.: 18/920,420

(22) Filed: Oct. 18, 2024

(65) Prior Publication Data

US 2026/0009859 A1 Jan. 8, 2026

(30) Foreign Application Priority Data

Jul. 4, 2024 (KR) ........................ 10-2024-0088063
Jul. 23, 2024 (KR) ........................ 10-2024-0096845

(51) Int. Cl.
*G01R 31/389* (2019.01)
*G01R 31/3842* (2019.01)
*G01R 31/396* (2019.01)
*G08B 21/18* (2006.01)
*H01M 10/42* (2006.01)

(52) U.S. Cl.
CPC ....... *G01R 31/389* (2019.01); *G01R 31/3842* (2019.01); *G01R 31/396* (2019.01); *G08B 21/182* (2013.01); *G08B 21/185* (2013.01); *H01M 10/425* (2013.01); *H01M 2010/4271* (2013.01)

(58) Field of Classification Search
CPC ........................... G01R 31/389; G01R 31/396; G01R 31/3842; G08B 21/182; G08B 21/185; H01M 10/425; H01M 2010/4271
USPC ........................................................ 324/430
See application file for complete search history.

(56) References Cited

U.S. PATENT DOCUMENTS

2017/0219660 A1* 8/2017 Christensen ......... G01R 31/392
2020/0014220 A1* 1/2020 Srinivasan .......... H01M 10/425

FOREIGN PATENT DOCUMENTS

CN 118198549 A * 6/2024 .............. B60L 58/10
KR 10-2558634 B1 7/2023
KR 10-2023-0126467 A 8/2023

OTHER PUBLICATIONS

Chen et al.; Translation of CN 118198549 A; Jun. 14, 2024; Translated by EPO & Google (Year: 2024).*

* cited by examiner

*Primary Examiner* — Son T Le
*Assistant Examiner* — Rahul Maini
(74) *Attorney, Agent, or Firm* — Bridgeway IP Law Group, PLLC; Jihun Kim

(57) ABSTRACT

An embodiment relates to an apparatus and method for proactive detection of thermal runaway using a battery management system (BMS) having an electrochemical impedance spectroscopy (EIS) function, and more specifically, to an apparatus and method for proactive detection of thermal runaway using a BMS having an EIS function which sets a quick diagnosis mode to measure impedance using only one preset frequency among multiple impedance measurement frequencies of the EIS of a module BMS when a thermal runaway prediction event occurs, and in a quick diagnosis mode, simultaneously measures the impedance of each cell in a battery module by the set frequency through the EIS, and predicts and alerts the possibility of thermal runaway according to the fluctuation deviation of the measured impedance.

15 Claims, 6 Drawing Sheets

401

402

APPARATUS AND METHOD FOR PROACTIVE DETECTION OF THERMAL RUNAWAY USING BMS WITH EIS FUNCTION

CROSS-REFERENCE TO RELATED APPLICATION

This application claims the benefit of Korean Patent Application No. 10-2024-0088063 filed on Jul. 4, 2024, in the Korean Intellectual Property Office, the entire disclosure of which is incorporated herein by reference for all purposes.

BACKGROUND

1. Field of the Invention

The present disclosure relates to an apparatus and method for proactive detection of thermal runaway using a battery management system (BMS) having an electrochemical impedance spectroscopy (EIS) function, and more specifically, to an apparatus and method for proactive detection of thermal runaway using a BMS having an EIS function which sets a quick diagnosis mode to measure impedance using only one preset frequency among multiple impedance measurement frequencies of the EIS of a module BMS when a thermal runaway prediction event occurs, and in a quick diagnosis mode, simultaneously measures the impedance of each cell in a battery module by the set frequency through the EIS, and predicts and alerts the possibility of thermal runaway according to the fluctuation deviation of the measured impedance.

2. Description of the Related Art

Recently, advanced air mobility (AAM) technologies, including electric bicycles, electric kickboards, electric vehicles, urban air mobility (UAM), and regional air mobility (RAM), have been researched and developed and are rapidly advancing, and electric bicycles, electric kickboards, and electric vehicles have been commercialized and applied in real life, and can be easily seen around.

Typically, these mobilities are applied with batteries of various types and sizes to reduce environmental pollution and operating costs.

As batteries are applied to a wide variety of mobility types, countless waste batteries are being generated, and even more waste batteries are expected to be generated in the future.

Therefore, although they cannot be used in mobility, they can be used for general energy storage purposes, and efforts are being made to develop a waste battery recycling system to reuse waste batteries generated from mobility, and a representative system is an energy storage system (ESS) that stores and uses the generated renewable energy in waste batteries.

Typically, lithium-ion batteries are used as such batteries.

A lithium-ion battery converts chemical energy into electrical energy through oxidation and reduction reactions between the positive electrode (+) and the negative electrode (−). The lithium-ion battery contains lithium oxide (Li+O), which is a combination of lithium and oxygen at the positive electrode (+), and is vulnerable to fire and explosion.

In such systems using the conventional lithium-ion battery, OFF-CAS sensors, smoke detection sensors, and thermal imaging cameras are installed to detect fire and explosion in order to quickly prepare for fire and explosion.

However, conventional OFF-CAS sensors, smoke detection sensors, thermal imaging cameras, and other thermal runaway-related equipment all detect thermal runaway after it has occurred, and thus cannot prevent fire and explosion, and do not guarantee sufficient time to reduce the spread of fire.

In addition, batteries using conventional lithium-ion batteries are managed by monitoring the charging/discharging, overcharging, temperature, etc., of battery cells by applying a BMS.

FIG. 1 is a diagram illustrating a battery configuration of a typical battery pack or rack unit of an ESS which shows a case where battery modules are connected in series, and FIG. 2 is a diagram illustrating a typical thermal runaway occurrence graph according to voltage.

Referring to FIGS. 1 and 2, typically, a battery such as a battery pack and rack unit of an ESS includes one or more (m=1, 2, 3 . . . ) battery modules 20 which includes multiple (battery) cells 40 and includes a plurality of (n) module BMSs 30 configured to monitor the cells in units of a predetermined number of cells, and a main BMS 10 configured to collect voltage, current, temperature, etc., of battery module 20 units collected through the battery modules 20 to manage the charging/discharging management, overcharging management, and abnormal conditions of the corresponding battery modules 20.

The plurality of battery modules 20 may be connected in series as shown in FIG. 1 or in parallel depending on the characteristics of the system to be configured.

Each module BMS 30 of the battery module 20 is configured to measure the voltage and current of each cell 40 in units of 16 cells 40 as shown in FIG. 1, and sequentially process the cells 40 under responsibility through temperature sensors 50 installed at intervals in units of a specific number (e.g., 3 to 4) to monitor the temperature of the cells 40 in which the temperature sensors 50 are installed.

However, since thermal runaway and fire occur due to rapid and quick temperature rise as shown in FIG. 2, the conventional main BMS 10 cannot detect a fire before it spreads to a cell 40 where a temperature sensor 50 is installed in the event of thermal runaway or fire in a cell 40 where a temperature sensor is not installed, and it detects only after the thermal runaway or fire, it is limited to post-fire measures, and therefore has a problem in that it is ineffective in detecting thermal runaway or fire.

As such, the conventional BMS system cannot prevent fire caused by thermal runaway in advance and only performs post-detection, so there was a problem that a battery fire could spread into a large fire.

PRIOR-ART DOCUMENT

Patent Document (Patent Document 1) Korean Patent No. 10-2558634 (Jul. 25, 2023)

SUMMARY

Therefore, an object of the present disclosure is to provide an apparatus and method for proactive detection of thermal runaway using a BMS with an EIS function which sets a quick diagnosis mode to measure impedance using only one preset frequency among multiple impedance measurement frequencies of the EIS of the module BMS when a thermal runaway prediction event occurs, and in the quick diagnosis mode, simultaneously measures the impedance of each cell in the battery module by the set frequency through the EIS, and predicts and alerts the possibility of thermal runaway according to the fluctuation deviation of the measured impedance.

An apparatus for proactive detection of thermal runaway using a battery management system (BMS) with an electrochemical impedance spectroscopy (EIS) function according to an embodiment of the present disclosure to achieve the object includes: a battery module including a plurality of cells and a plurality of module BMSs, each configured to connect a predetermined number of cells among the plurality of cells and including an EIS meter configured to measure impedance of the connected cells using EIS for measuring impedance using multiple frequencies to monitor the impedance of the cells and, when a quick diagnosis mode setting request occurs, set a quick diagnosis mode and measure the impedance of the cells at a quick diagnosis mode frequency, which is one of the frequencies of the EIS; and a main BMS configured to monitor an occurrence of a thermal runaway diagnosis event, and when the thermal runaway diagnosis event occurs, control the module BMS to set to the quick diagnosis mode, measure impedance of a cell of the battery module by the quick diagnosis mode frequency in the quick diagnosis mode, and when the measured impedance exceeds a reference value and a change amount of the impedance exceeds a reference change amount, predict that thermal runaway will occur in the battery module including the cell and generate an alarm.

The module BMS of the battery module may be configured to define the quick diagnosis mode frequency, and when the quick diagnosis mode setting request occurs from the main BMS, set the quick diagnosis mode.

The main BMS may be configured to define the quick diagnosis mode frequency, and when the thermal runaway diagnosis event occurs, transmit quick diagnosis mode setting request information including quick diagnosis mode frequency information to the module BMS to request the setting of the quick diagnosis mode, and the module BMS may be configured to, when the quick diagnosis mode setting request occurs by receiving the quick diagnosis mode setting request information, set the quick diagnosis mode by defining a frequency of the quick diagnosis mode frequency information included in the quick diagnosis mode setting request information as the quick diagnosis mode frequency.

The main BMS may be configured to, when the battery module is fully charged, determine that the thermal runaway diagnosis event occurs.

The main BMS may be configured to simultaneously measure the impedance of cells of the same order for each module BMS for the predetermined number of cells connected by each module BMS.

The main BMS may be configured to, when the impedance measured for a cell exceeds the reference value and is determined to be abnormal, set a repeated measurement number and a cycle for the cell, and repeatedly measure the impedance of the cell at the cycle within the repeated measurement number, and if a change amount of the impedance exceeds the reference change amount, predict that thermal runaway will occur.

The main BMS may be configured to, after determining that the cell is abnormal, if the measured impedance is equal to or less than the reference value, reduce the repeated measurement number, and when the impedance is repeatedly measured to be equal to or less than the reference value and the repeated measurement number becomes zero (0), set to a normal state.

A method for proactive detection of thermal runaway using a BMS with an EIS function according to an embodiment of the present disclosure to achieve the object includes: a quick diagnosis mode setting process in which a main BMS controls a module BMS to set to a quick diagnosis mode when a thermal runaway diagnosis event occurs; an impedance measuring process in which the module BMS, which is configured to connect a predetermined number of cells among a plurality of cells and includes an EIS meter configured to measure impedance of the connected cells using EIS for measuring impedance using multiple frequencies, measures the impedance of the cells at a quick diagnosis mode frequency, which is one frequency of the quick diagnosis mode, and provides it to the main BMS; and a thermal runaway monitoring process in which the main BMS measures the impedance of a cell of a battery module by the quick diagnosis mode frequency in the quick diagnosis mode, and if the measured impedance exceeds a reference value and a change amount of the impedance exceeds a reference change amount, predicts that a thermal runaway will occur in the battery module including the cell and generates an alarm.

The quick diagnosis mode setting process may include a quick diagnosis mode setting request step in which the main BMS transmits quick diagnosis mode setting request information to request the setting of the quick diagnosis mode to the module BMS when the thermal runaway diagnosis event occurs; and a quick diagnosis mode setting step in which the module BMS sets the quick diagnosis mode by setting a predefined frequency among the multiple frequencies of the EIS as the quick diagnosis mode frequency when the quick diagnosis mode setting request information is received from the main BMS.

The quick diagnosis mode setting process may include a quick diagnosis mode setting request step in which the main BMS transmits quick diagnosis mode setting request information including quick diagnosis mode frequency information to request the setting of the quick diagnosis mode to the module BMS, when the thermal runaway diagnosis event occurs; and a quick diagnosis mode setting step in which the module BMS sets the quick diagnosis mode by setting a frequency of the quick diagnosis mode frequency information of the quick diagnosis mode setting request information as the quick diagnosis mode frequency of the EIS meter, when the quick diagnosis mode setting request information is received from the main BMS.

The quick diagnosis mode setting process may further include a thermal runaway diagnosis event monitoring step in which the main BMS monitors whether the battery module is fully charged, and when the battery module is fully charged, determines that the thermal runaway diagnosis event occurs, and in the thermal runaway diagnosis event monitoring step, the main BMS may perform the quick diagnosis mode setting request step when the thermal runaway diagnosis event occurs.

The module BMS may be, in the impedance measuring process, synchronized to the control of the main BMS for the predetermined number of cells connected to measure the impedance of cells in the same order as another module BMS in a predetermined order and transmit it to the main BMS.

The module BMS may be configured to determine the order of impedance measurement according to a serial connection order of the cells connected to the module BMS.

The thermal runaway monitoring process may include a concentrated monitoring setting step in which the main BMS sets a repeated measurement number and a cycle for a cell, when the impedance measured in the cell in the quick diagnosis mode exceeds the reference value and is determined to be abnormal; and a thermal runaway prediction step in which the main BMS repeatedly measures the impedance of the cell at the cycle within the repeated measurement number, and if a change amount of the impedance exceeds the reference change amount, predicts that thermal runaway will occur.

The thermal runaway monitoring process may include a thermal runaway error prevention step in which, after determining that the cell is abnormal, the main BMS reduces the repeated measurement number if the measured impedance is determined to be equal to or less than the reference value, and sets to a normal state when the impedance is repeatedly measured to be equal to or less than the reference value and the repeated measurement number becomes zero (0).

According to the present disclosure, it is possible to detect an abnormal section by cell-by-cell impedance measured through a module BMS having an impedance measurement function using the EIS, and predict whether thermal runaway occurs in the abnormal section.

In addition, according to the present disclosure, it is possible to prevent false prediction of thermal runaway due to temporary impedance abnormality by determining whether to proceed with thermal runaway or a normal operation by tracking a predetermined number of times or more even when the abnormal section is detected.

In addition, according to the present disclosure, it is possible to simultaneously measure impedance for cells of the same order in a plurality of battery modules and perform thermal runaway prediction based thereon.

In addition, according to the present disclosure, it is possible to more quickly check whether thermal runaway occurs for multiple cells, by setting a quick diagnosis mode which sets only one preset frequency among multiple frequencies used in impedance measurement using the EIS when a thermal runaway diagnosis event occurs, and measuring impedance using only one frequency set in the quick diagnosis mode.

In addition, the present disclosure preferably uses a relatively high frequency among multiple impedance measurement frequencies of the EIS in the quick diagnosis mode, but experimental results show that the possibility of thermal runaway occurrence may be detected at any frequency among all impedance measurement frequencies. Therefore, according to the present disclosure, it is possible to detect the occurrence of thermal runaway more quickly by measuring impedance at a relatively high frequency.

DETAILED DESCRIPTION

Hereinafter, referring to the accompanying drawings, a configuration of a thermal runaway proactive detection apparatus using a BMS having an EIS function of a battery system according to the present disclosure will be described, and a thermal runaway proactive detection method in the thermal runaway proactive detection apparatus will be described.

Figure 1:
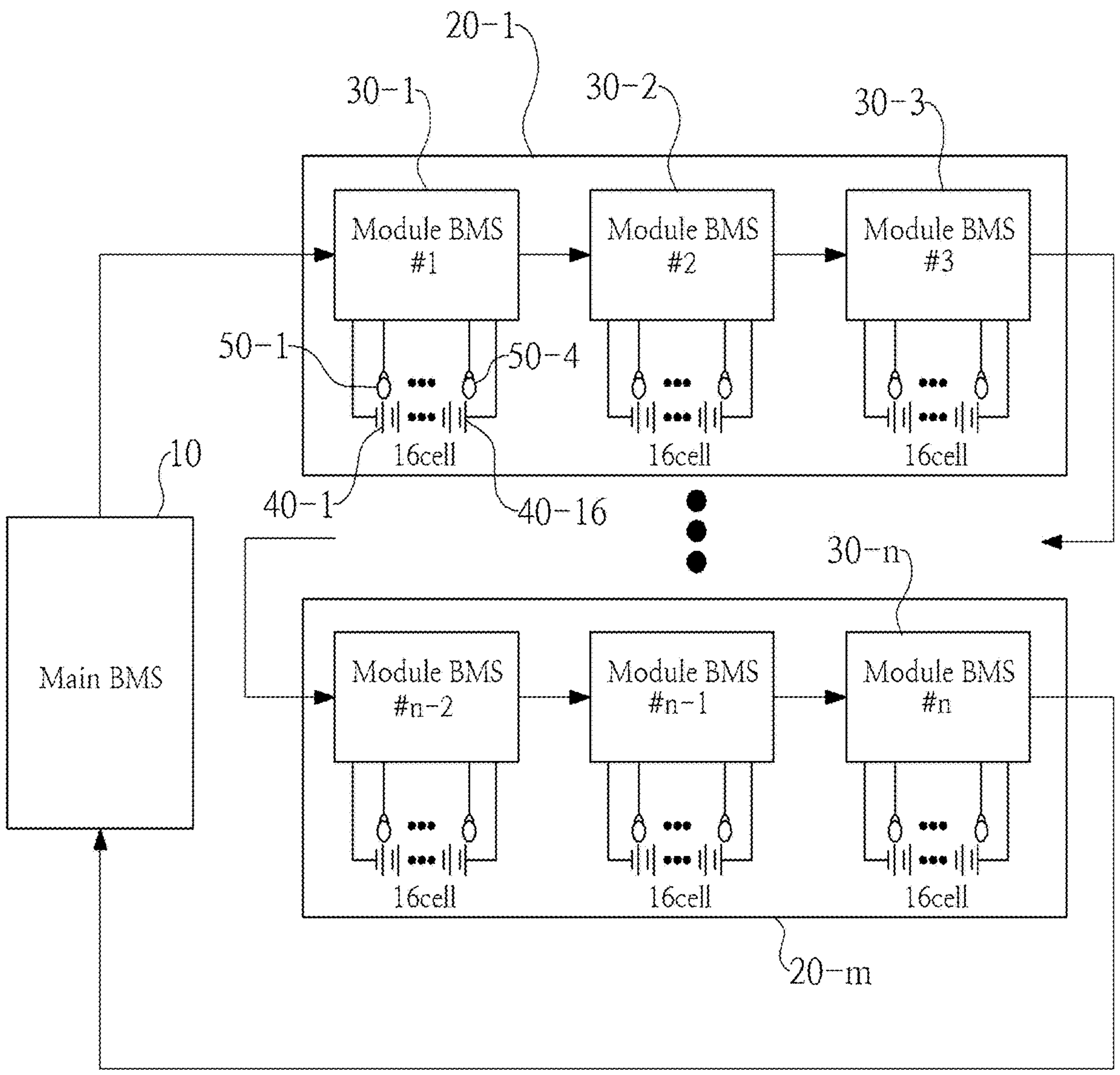
FIG. 1 is a diagram illustrating a battery configuration of a typical battery pack or rack unit of an ESS.
Figure 2:
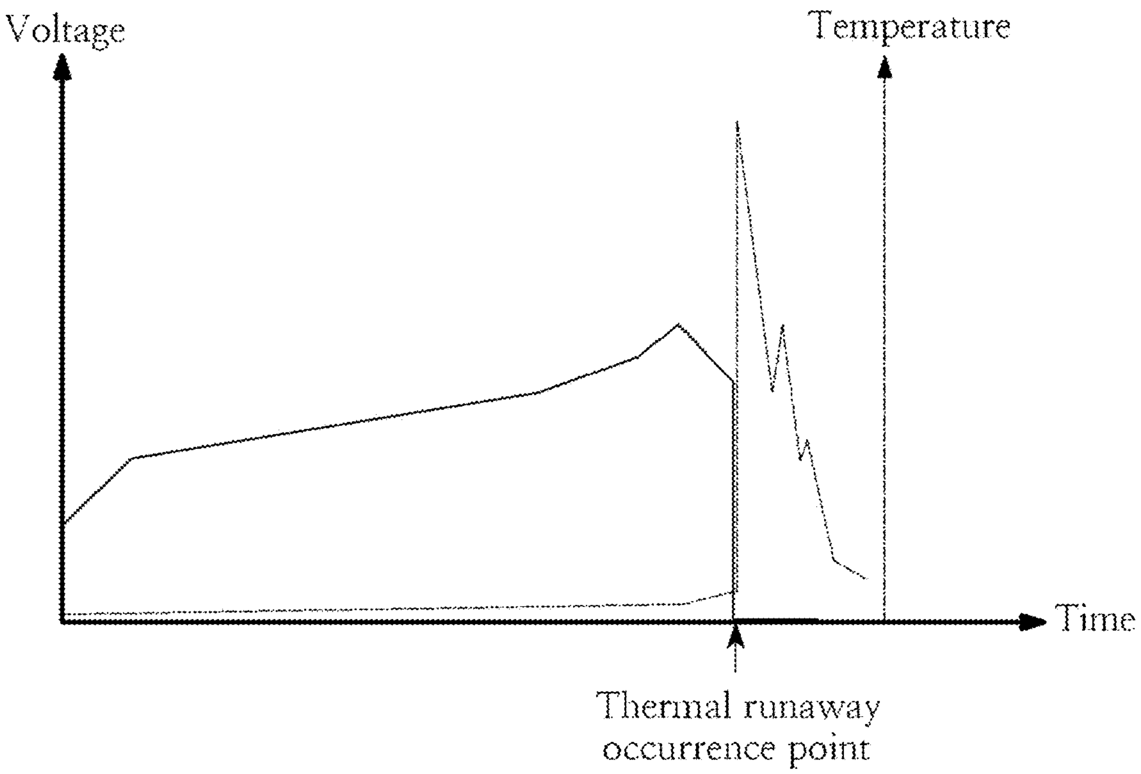
FIG. 2 is a diagram illustrating a typical thermal runaway occurrence graph according to voltage.
Figure 3:
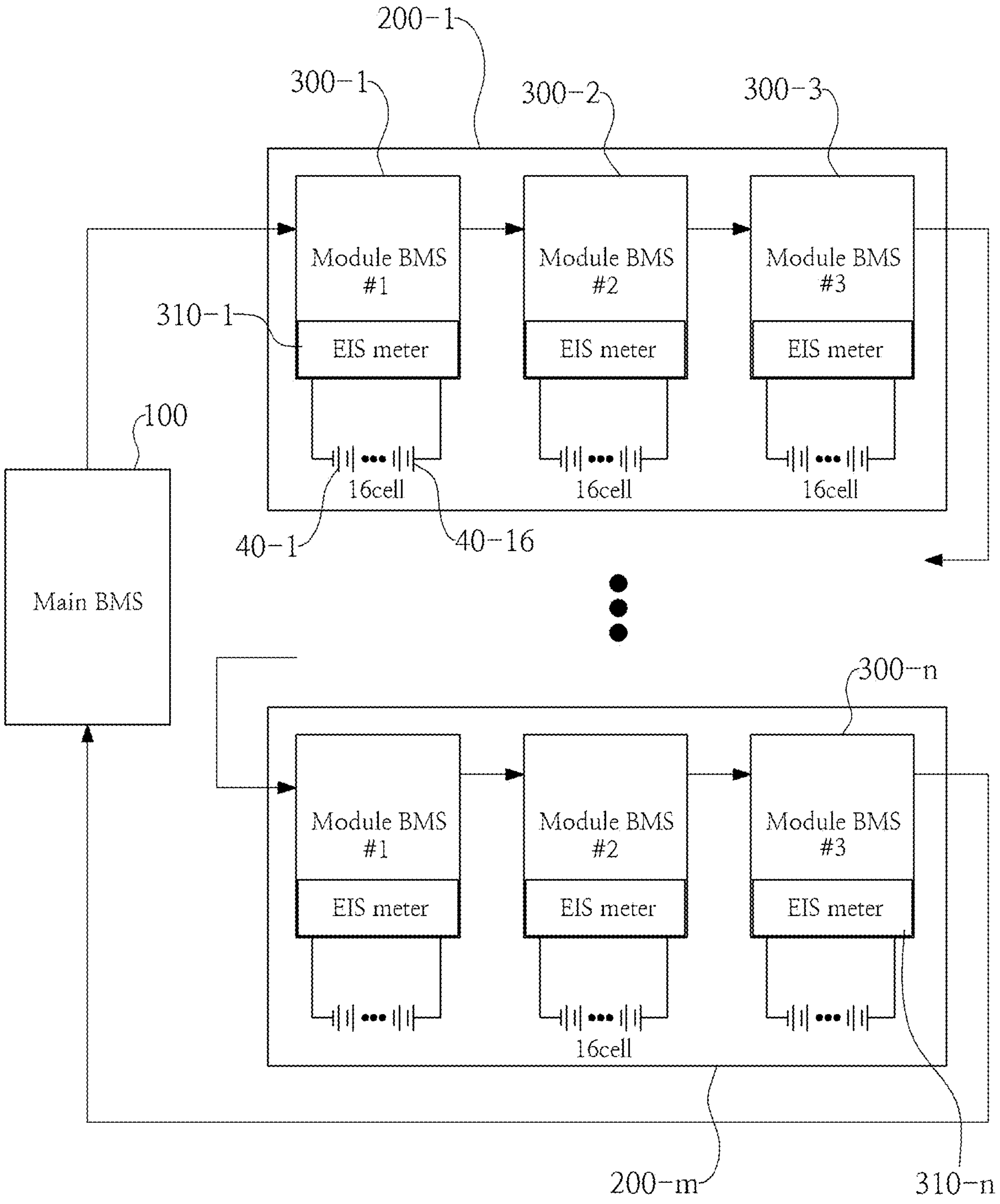
FIG. 3 is a diagram illustrating a configuration of a battery system configured with a thermal runaway proactive detection apparatus using a BMS having an EIS function according to the present disclosure.
Figure 4:
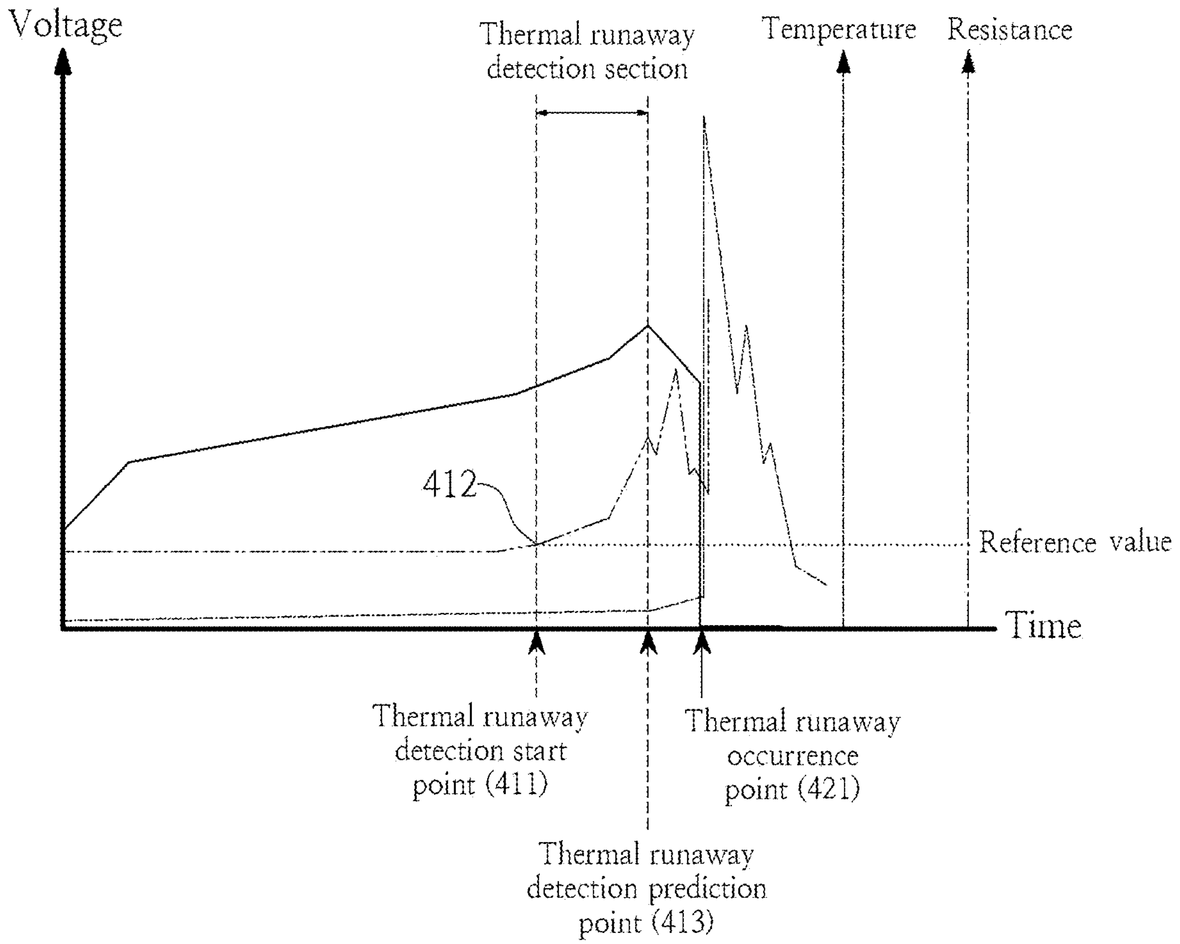
FIG. 4 is a graph illustrating changes in voltage and temperature over time, changes in impedance over voltage and temperature, and a thermal runaway occurrence point according to the present disclosure.
Figure 5:
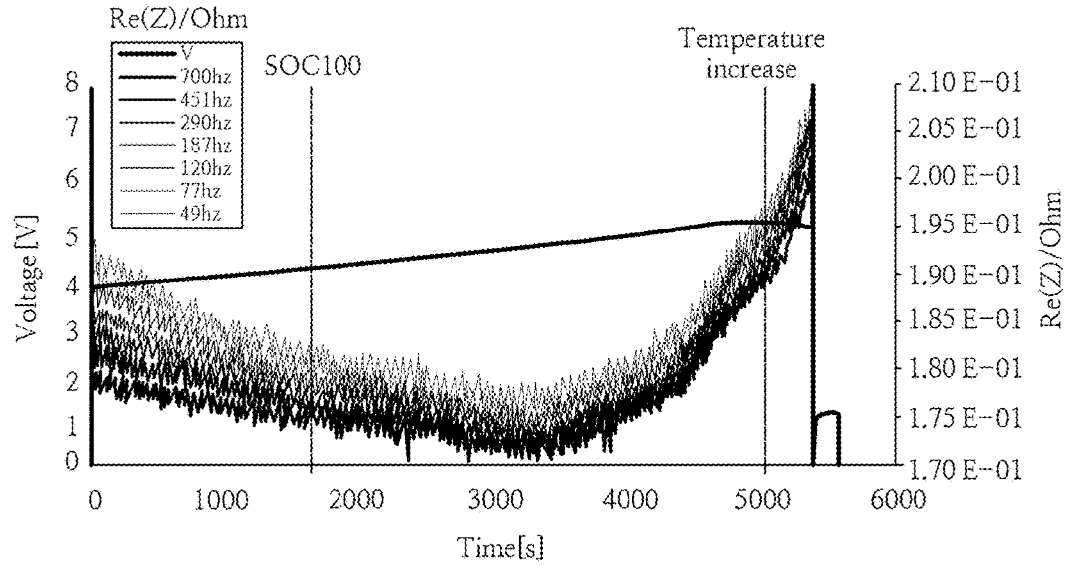
FIG. 5 is a graph illustrating changes in impedance at different frequencies of EIS under overcharge and overtemperature conditions according to an embodiment of the present disclosure.
Figure 5:
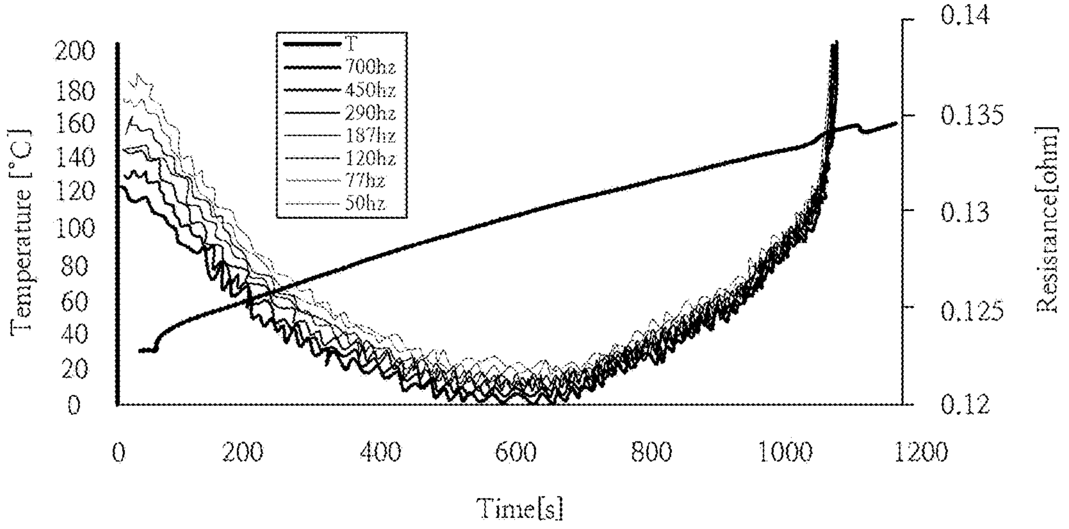

FIG. 3 is a diagram illustrating a configuration of a battery system configured with a thermal runaway proactive detection apparatus using a BMS having an EIS function according to the present disclosure, FIG. 4 is a graph illustrating changes in voltage and temperature over time, changes in impedance over voltage and temperature, and a thermal runaway occurrence point according to the present disclosure, and FIG. 5 is a graph illustrating changes in impedance at different frequencies of EIS under overcharge and overtemperature conditions according to an embodiment of the present disclosure. Hereinafter, the explanation will be made with reference to FIGS. 3 to 5.

A thermal runaway proactive detection apparatus using a BMS having an EIS function according to the present disclosure includes a main BMS 100 and a plurality of battery modules 200. The main BMS 100 and the plurality of battery modules 200 may be connected in series as shown in FIG. 3, or in parallel.

The battery module 200 according to the present disclosure includes multiple cells 40, and includes a plurality of module BMSs 300 configured to manage the multiple cells 40 by connecting them in units of a predetermined number and transmit battery status information measured during management to the main BMS 100. For example, the battery module 200 may include 48 cells 40, and when provided with three module BMSs 300 as shown in FIG. 3, each module BMS 300 is connected to 16 cells as shown in FIG. 3 to monitor the battery status of the 16 cells, generate battery status information according to the battery status, and provide it to the main BMS 100.

The module BMS 300 according to the present disclosure includes an electrochemical impedance spectroscopy (EIS) meter 310 that measures the impedance of the cell 40 according to the EIS.

The EIS meter 310 supplies an AC signal having multiple frequencies (hereinafter referred to as "impedance measurement frequencies") to the cell 40, and measures the impedance (Z) using the current and voltage measured accordingly.

The EIS meter 310 according to the present disclosure is provided with a quick diagnosis function for measuring the impedance of the cell 40 at one frequency (hereinafter referred to as a "quick diagnosis mode frequency") among the multiple impedance measurement frequencies for quick impedance measurement in a quick diagnosis mode.

The module BMS 300 provided with the EIS meter 310 sets the quick diagnosis mode by receiving quick diagnosis mode setting request information from the main BMS 100, in other words, under the control of the main BMS 100, and operates the EIS meter 310 in the quick diagnosis mode to measure the impedance of the cells 40.

The module BMS 300 sequentially measures the impedance of the cells 40 that it is connected to and manages in order. When the cells 40 are connected in series as in FIG.

3, the order is preferably the order in which the cells are connected in series, and may also be a preset order (such as order setting by cell index).

The module BMS 300 has the quick diagnosis mode frequency defined in advance, and sets the quick diagnosis mode when receiving the quick diagnosis mode setting request information from the main BMS 100 to measure the impedance of the cells 40 only with the quick diagnosis mode frequency. The quick diagnosis mode frequency is one of the multiple impedance measurement frequencies defined in the EIS, and it is preferable that it be a relatively high frequency.

In addition, according to another embodiment, the module BMS 300 receives quick diagnosis mode setting request information including quick diagnosis mode frequency information for the quick diagnosis mode frequency from the main BMS 100, sets the frequency of the quick diagnosis mode frequency information included in the quick diagnosis mode setting request information to the quick diagnosis mode frequency, and measures the impedance of the cell 40 only with the quick diagnosis mode frequency after setting the quick diagnosis mode.

In the quick diagnosis mode, the EIS meter 310 uses only one impedance measurement frequency (=quick diagnosis mode frequency) to measure the impedance of a single cell rather than multiple impedance measurement frequencies, so the impedance of cells may be quickly measured to detect thermal runaway in advance.

The main BMS 100 monitors the occurrence of a thermal runaway diagnosis event, and when the thermal runaway diagnosis event occurs, controls the module BMS 300 to set to the quick diagnosis mode, measures impedance of the cell 40 of the battery module 200 by the quick diagnosis mode frequency in the quick diagnosis mode, and if the measured impedance exceeds a reference value and a change amount of the impedance exceeds a reference change amount, predicts that thermal runaway will occur in the battery module including the cell 40 and generate an alarm.

The main BMS 100 determines that the thermal runaway diagnosis event occurs upon request from an administrator or when the battery is fully charged.

The impedance of the battery (cell) measured by multiple impedance measurement frequencies of the EIS meter 310 forms a graph (blue) as shown in FIG. 4 until a thermal runaway occurrence point 421 is reached.

Therefore, if the impedance measured at a thermal runaway detection the start point 411 exceeds a reference value 412, the main BMS 100 determines that it is out of the normal range and specifies the number of repeated measurements (hereinafter, referred to as a “repeated measurement number”) for the cell that is out of the normal range, changes and sets the measurement cycle, then measures the impedance for the repeated measurement number for the cell with the cycle, and checks whether the change amount of the impedance in the abnormal range, i.e., in the abnormal state, exceeds a reference change amount.

The main BMS 100 predicts that there is a possibility of thermal runaway occurrence when the measured impedance change amount exceeds the reference change and generates an alarm.

In FIG. 4, the main BMS 100 may be able to predict the possibility of thermal runaway occurrence between the thermal runaway detection start point 411, which is earlier than the thermal runaway occurrence point 421, and a thermal runaway detection prediction point 413.

The quick diagnosis mode is a mode in which impedance is measured using only one frequency (i.e., quick diagnosis mode frequency) among multiple impedance measurement frequencies used by the EIS meter 310 to quickly predict the possibility of thermal runaway occurrence.

As shown in FIG. 5, even if impedance is measured using only one random frequency among multiple frequencies of the EIS, it may be seen that a waveform similar to the impedance graph of FIG. 4 is shown. In other words, it may be seen from FIG. 5 that the possibility of thermal runaway can be predicted by measuring impedance with only one frequency.

Figure 6:
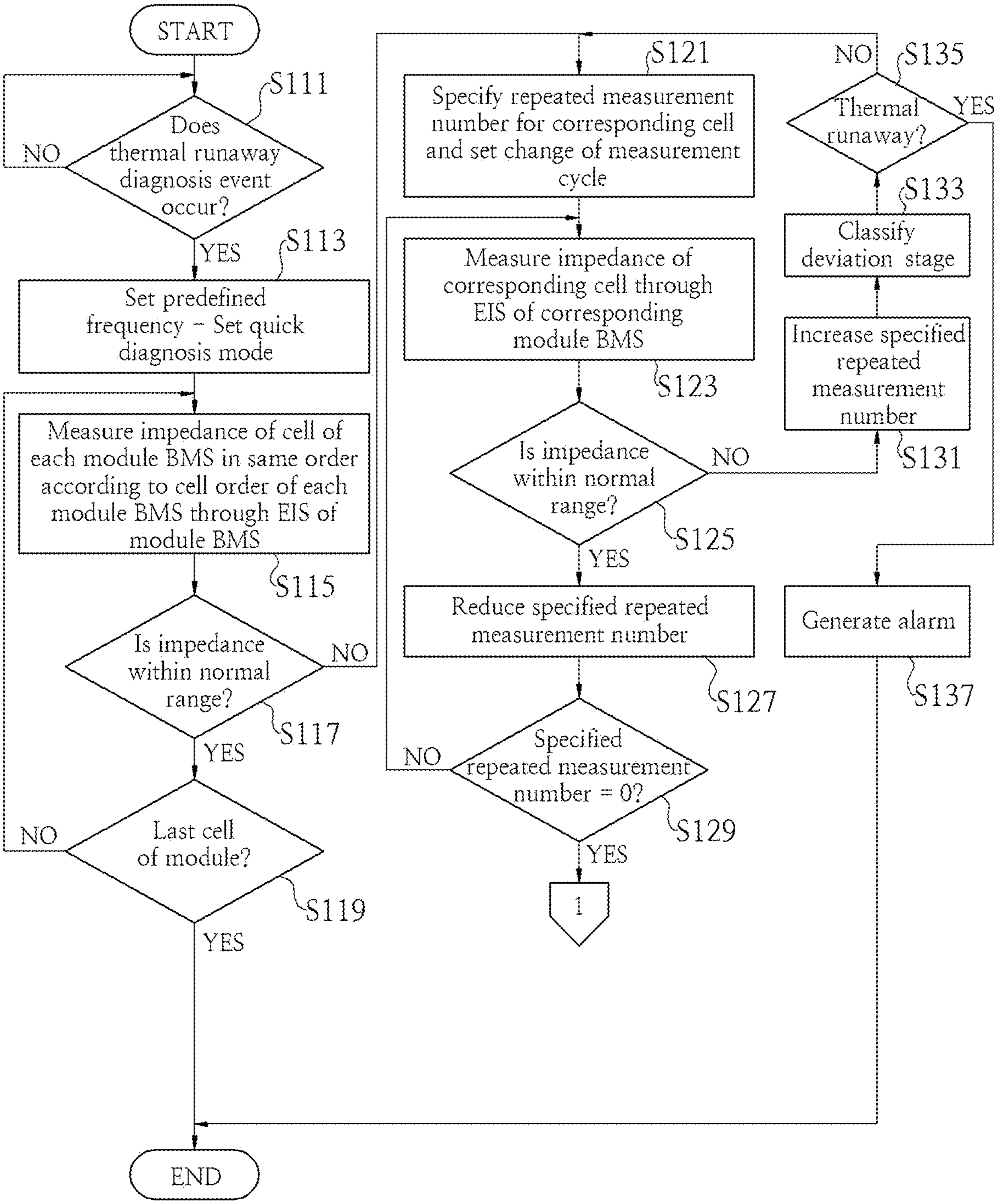
FIG. 6 is a flowchart illustrating a thermal runaway proactive detection method using a BMS having an EIS function according to the present disclosure.

As shown in FIG. 5, the main BMS 100 predicts the possibility of thermal runaway by taking only the real part of the impedance including the measured real part and imaginary part. FIG. 6 is a flowchart illustrating a thermal runaway proactive detection method using a BMS having an EIS function according to the present disclosure.

Hereinafter, referring to FIG. 6, the main BMS 100 determines whether the thermal runaway diagnosis event occurs (S111). The thermal runaway diagnosis event may occur when a thermal runaway diagnosis request is made by the administrator, or may occur when a specific battery module 200 or the entire battery module 200 is fully charged.

When the thermal runaway diagnosis event occurs, the main BMS 100 transmits the quick diagnosis mode setting request information to the module BMS 300 to set the module BMS 300 to the quick diagnosis mode and also sets itself to the quick diagnosis mode (S113).

When the quick diagnosis mode is set, the main BMS 100 simultaneously obtains the impedance of the cell 40 of each module BMS in the same order according to the cell order of each module BMS 300 through the EIS meter 310 of the module BMS 300 (S115).

When the impedance of the cell 40 is acquired, the main BMS 100 determines whether the impedance is within the normal range (S117).

If it is within the normal range, the main BMS 100 acquires the impedance for the next cell 40 through the module BMS 300 and determines whether the impedance is within the normal range (S117).

In this way, if the impedance of the cell 40 is within the normal range, the process is repeated up to the last cell 40 of the module BMS 300 to determine whether the impedance of the cell 40 is within the normal range (S119).

On the other hand, if an impedance outside the normal range is detected in the normal range determination of the impedance, the main BMS 100 controls the corresponding module BMS 300 to specify the repeated measurement number for the corresponding cell in order to measure the impedance by repeating by the repeated measurement number with the changed measurement cycle, and change and set the measurement cycle (S121).

When the repeated measurement number is specified and the measurement cycle is changed, the main BMS 100 measures the impedance of the corresponding cell through the EIS meter 310 of the corresponding module BMS 300 according to the changed measurement cycle (S123).

When the impedance is measured, the main BMS 100 determines whether the impedance is within the normal range that does not exceed the reference value (S125).

If the threshold value measured as before is outside the normal range, the main BMS 100 increases the repeated measurement number (S131), classifies the deviation stage according to the change amount between the previous impedance and the current impedance, and determines whether there is a possibility of thermal runaway by determining whether the deviation stage is greater than or equal to a preset stage, i.e., whether the impedance change amount exceeds a preset reference change amount (S135).

Again, the main BMS 100 specifies the repeated measurement number for the corresponding cell again (S121) according to the increase in the repeated measurement number (S131), and measures the impedance for the corresponding cell (S123) and repeatedly determines whether the impedance is within the normal range (S125) or whether the possibility of thermal runaway is confirmed (S135).

At this time, if it is confirmed that there is a possibility of thermal runaway occurrence, the main BMS 100 generates an alarm. The alarm may be a transmission of warning information including any one or more of generation of a warning sound, flashing of a warning LED, or flashing of a warning lamp, displaying of warning information through the display, main BMS information to the management center, module battery 200 and module BMS 300 information.

However, if the measured impedance returns to the normal range during the determination of whether the impedance is within the normal range (S125), the main BMS 100 reduces the repeated measurement number (S127) and determines whether the reduced repeated measurement number is zero (0) (S129).

If the repeated measurement number is not zero, after applying the repeated measurement number reduction in step S121 described above and re-specifying the repeated measurement number for the cell, it is repeatedly determined whether the measurement impedance of the cell is within the normal range.

In this way, it is possible to accurately determine whether thermal runaway is likely to occur for cells whose initial measured impedance is out of the normal range, and prevent incorrect determinations of whether thermal runaway is likely to occur.

Meanwhile, it will be readily understood by those skilled in the art that the present disclosure is not limited to the above-described typical preferred embodiments, but can be implemented by improving, changing, replacing or adding in various ways without departing from the gist of the present disclosure. If the implementation by such improvement, change, replacement or addition falls within the scope of the appended claims below, the technical idea thereof shall also be considered to belong to the present disclosure.

| [Explanation of Symbols] | |
|---|---|
| 40: Battery cell | 100: Main BMS |
| 200: Battery module | 300: Module BMS |
| 310: EIS meter | |

What is claimed is:

1. An apparatus for proactive detection of thermal runaway using a battery management system (BMS) with an electrochemical impedance spectroscopy (EIS) function, the apparatus comprising:

a battery module comprising a plurality of cells and a plurality of module BMSs, each configured to connect a predetermined number of cells among the plurality of cells and comprising an EIS meter configured to measure impedance of the connected cells using EIS for measuring impedance using multiple frequencies to monitor the impedance of the cells and, when a quick diagnosis mode setting request occurs, set a quick diagnosis mode and measure the impedance of the cells at a quick diagnosis mode frequency, which is one of the frequencies of the EIS; and a main BMS configured to monitor an occurrence of a thermal runaway diagnosis event, and when the thermal runaway diagnosis event occurs, control the module BMS to set to the quick diagnosis mode, measure impedance of a cell of the battery module by the quick diagnosis mode frequency in the quick diagnosis mode, and when the measured impedance exceeds a reference value and a change amount of the impedance exceeds a reference change amount, predict that thermal runaway will occur in the battery module comprising the cell and generate an alarm.

2. The apparatus of claim 1, wherein the module BMS of the battery module is configured to define the quick diagnosis mode frequency, and when the quick diagnosis mode setting request occurs from the main BMS, set the quick diagnosis mode.

3. The apparatus of claim 1, wherein the main BMS is configured to define the quick diagnosis mode frequency, and when the thermal runaway diagnosis event occurs, transmit quick diagnosis mode setting request information including quick diagnosis mode frequency information to the module BMS to request the setting of the quick diagnosis mode, and the module BMS is configured to, when the quick diagnosis mode setting request occurs by receiving the quick diagnosis mode setting request information, set the quick diagnosis mode by defining a frequency of the quick diagnosis mode frequency information included in the quick diagnosis mode setting request information as the quick diagnosis mode frequency.

4. The apparatus of claim 3, wherein the main BMS is configured to, when the battery module is fully charged, determine that the thermal runaway diagnosis event occurs.

5. The apparatus of claim 1, wherein the main BMS is configured to simultaneously measure the impedance of cells of the same order for each module BMS for the predetermined number of cells connected by each module BMS.

6. The apparatus of claim 5, wherein the main BMS is configured to, when the impedance measured for the cell exceeds the reference value and is determined to be abnormal, set a repeated measurement number and a cycle for the cell, and repeatedly measure the impedance of the cell at the cycle within the repeated measurement number, and if a change amount of the impedance exceeds the reference change amount, predict that thermal runaway will occur.

7. The apparatus of claim 6, wherein the main BMS is configured to, after determining that the cell is abnormal, if the measured impedance is equal to or less than the reference value, reduce the repeated measurement number, and when the impedance is repeatedly measured to be equal to or less than the reference value and the repeated measurement number becomes zero (0), set to a normal state.

8. A method for proactive detection of thermal runaway using a battery management system (BMS) with an electrochemical impedance spectroscopy (EIS) function, the method comprising:

a quick diagnosis mode setting process in which a main BMS controls a module BMS to set to a quick diagnosis mode when a thermal runaway diagnosis event occurs;

an impedance measuring process in which the module BMS, which is configured to connect a predetermined number of cells among a plurality of cells and comprises an EIS meter configured to measure impedance of the connected cells using EIS for measuring impedance using multiple frequencies, measures the impedance of the cells at a quick diagnosis mode frequency, which is one frequency of the quick diagnosis mode, and provides it to the main BMS; and a thermal runaway monitoring process in which the main BMS measures the impedance of a cell of a battery module by the quick diagnosis mode frequency in the quick diagnosis mode, and if the measured impedance exceeds a reference value and a change amount of the impedance exceeds a reference change amount, predicts that a thermal runaway will occur in the battery module comprising the cell and generates an alarm.

9. The method of claim 8, wherein the quick diagnosis mode setting process comprises:

a quick diagnosis mode setting request step in which the main BMS transmits quick diagnosis mode setting request information to request the setting of the quick diagnosis mode to the module BMS when the thermal runaway diagnosis event occurs; and a quick diagnosis mode setting step in which the module BMS sets the quick diagnosis mode by setting a predefined frequency among the multiple frequencies of the EIS as the quick diagnosis mode frequency when the quick diagnosis mode setting request information is received from the main BMS.

10. The method of claim 8, wherein the quick diagnosis mode setting process comprises:

a quick diagnosis mode setting request step in which the main BMS transmits quick diagnosis mode setting request information including quick diagnosis mode frequency information to request the setting of the quick diagnosis mode to the module BMS, when the thermal runaway diagnosis event occurs; and a quick diagnosis mode setting step in which the module BMS sets the quick diagnosis mode by setting a frequency of the quick diagnosis mode frequency information of the quick diagnosis mode setting request information as the quick diagnosis mode frequency of the EIS meter, when the quick diagnosis mode setting request information is received from the main BMS.

11. The method of claim 9, wherein the quick diagnosis mode setting process further comprises a thermal runaway diagnosis event monitoring step in which the main BMS monitors whether the battery module is fully charged, and when the battery module is fully charged, determines that the thermal runaway diagnosis event occurs, and in the thermal runaway diagnosis event monitoring step, the main BMS performs the quick diagnosis mode setting request step when the thermal runaway diagnosis event occurs.

12. The method of claim 11, wherein the module BMS is, in the impedance measuring process, synchronized to the control of the main BMS for the predetermined number of cells connected to measure the impedance of cells in the same order as another module BMS in a predetermined order and transmit it to the main BMS.

13. The method of claim 12, wherein the module BMS is configured to determine the order of impedance measurement according to a serial connection order of the cells connected to the module BMS.

14. The method of claim 8, wherein the thermal runaway monitoring process comprises:

a concentrated monitoring setting step in which the main BMS sets a repeated measurement number and a cycle for the cell, when the impedance measured in the cell in the quick diagnosis mode exceeds the reference value and is determined to be abnormal; and a thermal runaway prediction step in which the main BMS repeatedly measures the impedance of the cell at the cycle within the repeated measurement number, and if a change amount of the impedance exceeds the reference change amount, predicts that thermal runaway will occur.

15. The method of claim 14, wherein the thermal runaway monitoring process comprises a thermal runaway error prevention step in which, after determining that the cell is abnormal, the main BMS reduces the repeated measurement number if the measured impedance is determined to be equal to or less than the reference value, and sets to a normal state when the impedance is repeatedly measured to be equal to or less than the reference value and the repeated measurement number becomes zero (0).

* * * * *